(12) United States Patent
Forrest et al.

(10) Patent No.: US 11,121,336 B2
(45) Date of Patent: Sep. 14, 2021

(54) HYBRID PLANAR-MIXED HETEROJUNCTION FOR ORGANIC PHOTOVOLTAICS

(71) Applicant: THE REGENTS OF THE UNIVERSITY OF MICHIGAN, Ann Arbor, MI (US)

(72) Inventors: Stephen R. Forrest, Ann Arbor, MI (US); Jeramy D. Zimmerman, San Francisco, CA (US); Xin Xiao, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/646,154

(22) PCT Filed: Nov. 22, 2013

(86) PCT No.: PCT/US2013/071466
§ 371 (c)(1),
(2) Date: May 20, 2015

(87) PCT Pub. No.: WO2014/082006
PCT Pub. Date: May 30, 2014

(65) Prior Publication Data
US 2015/0349283 A1 Dec. 3, 2015

Related U.S. Application Data

(60) Provisional application No. 61/729,376, filed on Nov. 22, 2012.

(51) Int. Cl.
*H01L 51/42* (2006.01)
*H01L 51/00* (2006.01)
*B82Y 10/00* (2011.01)

(52) U.S. Cl.
CPC .......... *H01L 51/4253* (2013.01); *B82Y 10/00* (2013.01); *H01L 51/0056* (2013.01);
(Continued)

(58) Field of Classification Search
CPC .. B82Y 10/00; H01L 2251/552; Y02E 10/549
See application file for complete search history.

(56) References Cited

U.S. PATENT DOCUMENTS

2004/0066135 A1* 4/2004 Lecloux ............... C07D 401/04
313/503
2005/0224113 A1* 10/2005 Xue .................... H01L 51/0037
136/263

(Continued)

FOREIGN PATENT DOCUMENTS

CN 101310395 A 11/2008
CN 101369630 A 2/2009

(Continued)

OTHER PUBLICATIONS

International Search Report and Written Opinion in PCT/US2013/071466 (11 pages).

(Continued)

*Primary Examiner* — Vongsavanh Sengdara
(74) *Attorney, Agent, or Firm* — Finnegan, Henderson, Farabow, Garrett & Dunner LLP

(57) ABSTRACT

Disclosed herein are organic photosensitive optoelectronic devices comprising two electrodes in superposed relation; a mixed photoactive layer located between the two electrodes, wherein the mixed photoactive layer comprises at least one donor material having a HOMO energy and at least one acceptor material having a LUMO energy, wherein the at least one donor material and the at least one acceptor material form a mixed donor-acceptor heterojunction; a photoactive layer adjacent to and interfacing with the mixed
(Continued)

photoactive layer, wherein the photoactive layer comprises a material having a LUMO energy within 0.3 eV of the LUMO energy of the at least one acceptor material or a HOMO energy within 0.3 eV of the HOMO energy of the at least one donor material; and a buffer layer adjacent to and interfacing with the mixed photoactive layer.

9 Claims, 4 Drawing Sheets

(52) U.S. Cl.
CPC ...... *H01L 51/0046* (2013.01); *H01L 51/0072* (2013.01); *H01L 2251/552* (2013.01); *Y02E 10/549* (2013.01)

(56) References Cited

U.S. PATENT DOCUMENTS

| | | | |
|---|---|---|---|
| 2006/0027802 A1* | 2/2006 | Forrest | H01L 51/424 257/40 |
| 2007/0096085 A1* | 5/2007 | Rand | H01L 51/4246 257/40 |
| 2009/0050878 A1 | 2/2009 | Okada et al. | |
| 2009/0235971 A1* | 9/2009 | Pfeiffer | H01L 51/0078 136/244 |
| 2010/0224252 A1* | 9/2010 | Scharber | H01L 51/0043 136/263 |
| 2011/0168248 A1 | 7/2011 | Koenemann et al. | |
| 2012/0085413 A1* | 4/2012 | Choi | C09D 125/18 136/263 |
| 2012/0090685 A1* | 4/2012 | Forrest | H01L 51/0012 136/263 |
| 2012/0279549 A1 | 11/2012 | Urien et al. | |
| 2013/0019937 A1* | 1/2013 | So | H01L 51/442 136/256 |
| 2013/0255758 A1* | 10/2013 | Rand | H01L 51/4253 136/255 |
| 2013/0320302 A1* | 12/2013 | Park | H01L 51/4213 257/14 |
| 2014/0020739 A1* | 1/2014 | Yang | H01L 27/302 136/255 |
| 2014/0084266 A1* | 3/2014 | Yang | H01L 51/5203 257/40 |
| 2014/0167002 A1* | 6/2014 | Welch | C07D 498/04 257/40 |
| 2015/0027529 A1* | 1/2015 | Barr | H01L 51/0021 136/256 |

FOREIGN PATENT DOCUMENTS

| | | |
|---|---|---|
| JP | 2011520263 A | 7/2011 |
| JP | 2012504343 A | 2/2012 |
| WO | WO 2005101523 | 10/2005 |
| WO | WO 2006/103863 | 10/2006 |
| WO | WO 2010/036398 | 4/2010 |
| WO | WO 2010/036963 | 4/2010 |
| WO | WO 2010/059240 A1 | 5/2010 |
| WO | WO 2011/041407 | 4/2011 |
| WO | WO 2011/080470 | 7/2011 |

OTHER PUBLICATIONS

Xue et al., "Mixed donor-acceptor molecular heterojunctions for photovoltaic applications. II. Device Performance," J. Appl. Phys., vol. 98, No. 12, pp. 124903-1 to 124903-9 (2005).

Xue et al., "A Hybrid Planar-Mixed Molecular Heterojunction Photovoltaic Cell," Adv. Mater., vol. 17, No. 1, pp. 66-71 (Jan. 6, 2005).

Uhrich et al., "Origin of open circuit voltage in planar and bulk heterojunction organic thin-film photovoltaics depending on doped transport layers," J. App. Phys., vol. 104, No. 4, pp. 43107-1 to 43107-6 (2008).

Zeng et al., *Effect of MoO₃ as an interlayer on the performance of organic solar cells based on ZnPc and C₆₀*, Synthetic Metals, vol. 161, No. 23, pp. 2748-2752 (2012).

* cited by examiner

HYBRID PLANAR-MIXED HETEROJUNCTION FOR ORGANIC PHOTOVOLTAICS

CROSS-REFERENCE TO RELATED APPLICATION

This application claims the benefit of U.S. Provisional Application No. 61/729,376, filed Nov. 22, 2012, which is incorporated herein by reference in its entirety.

STATEMENT REGARDING FEDERALLY SPONSORED RESEARCH

This invention was made with U.S. Government support under Contract No. DE-SC0000957 awarded by the U.S. Department of Energy, and under FA9550-110-1-0339 awarded by the Air Force Office of Scientific Research. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and Global Photonic Energy Corporation. The agreement was in effect on and before the date the subject matter of the present disclosure was prepared, and was made as a result of activities undertaken within the scope of the agreement.

The present disclosure generally relates to organic photosensitive devices and, in particular, a hybrid planar-mixed photosensitive device comprising a photoactive layer on a mixed photoactive layer.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF = \{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF^*(I_{SC}^*V_{OC})/P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A^* \eta_{ED}^* \eta_{CC}$$

$$\eta_{EXT} = \eta_A^* \eta_{INT}$$

The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

Buffer layers are important to organic photovoltaic (OPV) cells since they can improve carrier extraction. Some of the buffer layers can also protect the organic active layer and block excitons. Some of buffer layers, however, can also quench excitons, and therefore reduce the efficiency of the OPV cells. As a result, it is important to optimize the optical power distribution inside the device and reduce the absorption at the exciton quenching interface between the buffer layer and photoactive layers.

Thus, disclosed herein are novel hybrid planar-mixed devices comprising a photoactive layer on a mixed photoactive layer, wherein the photoactive layer is an exciton-generating optical spacer. Such an optical spacer redistributes the optical power inside the device, which in some embodiments can significantly improve the performance of the device.

Also disclosed herein are organic photosensitive optoelectronic devices comprising:
two electrodes in superposed relation;
a mixed photoactive layer located between the two electrodes, wherein the mixed photoactive layer comprises at least one donor material having a highest occupied molecular orbital (HOMO) energy and at least one acceptor material having a lowest unoccupied molecular orbital (LUMO) energy, wherein the at least one donor material and the at least one acceptor material form a mixed donor-acceptor heterojunction;
a photoactive layer adjacent to and interfacing with the mixed photoactive layer, wherein the photoactive layer comprises a material having a LUMO energy within 0.3 eV of the LUMO energy of the at least one acceptor material or a HOMO energy within 0.3 eV of the HOMO energy of the at least one donor material; and
a buffer layer adjacent to and interfacing with the mixed photoactive layer.

Also disclosed herein are organic photosensitive optoelectronic devices comprising: two electrodes in superposed relation; a mixed photoactive layer located between the two electrodes, wherein the mixed photoactive layer comprises at least one donor material having a HOMO energy and at least one acceptor material having a LUMO energy, wherein the at least one donor material and the at least one acceptor material form a mixed donor-acceptor heterojunction; a photoactive layer adjacent to and interfacing with the mixed photoactive layer, wherein the photoactive layer comprises a material having a LUMO energy within 0.3 eV of the LUMO energy of the at least one acceptor material or a HOMO energy within 0.3 eV of the HOMO energy of the at least one donor material, and wherein the mixed photoactive layer comprises the at least one donor material and the at least one acceptor material at a donor:acceptor ratio ranging from 1:1 to 1:50.

Also disclosed herein are organic photosensitive optoelectronic devices comprising: two electrodes in superposed relation; a mixed photoactive layer located between the two electrodes, wherein the mixed photoactive layer comprises at least one donor material having a HOMO energy and at least one acceptor material having a LUMO energy, wherein the at least one donor material and the at least one acceptor material form a mixed donor-acceptor heterojunction; a photoactive layer adjacent to and interfacing with the mixed photoactive layer, wherein the photoactive layer comprises a material having a LUMO energy within 0.3 eV of the LUMO energy of the at least one acceptor material or a HOMO energy within 0.3 eV of the HOMO energy of the at least one donor material, and wherein the photoactive layer has a thickness less than 50 nm.

The accompanying figures are incorporated in, and constitute a part of this specification.

Figure 1:
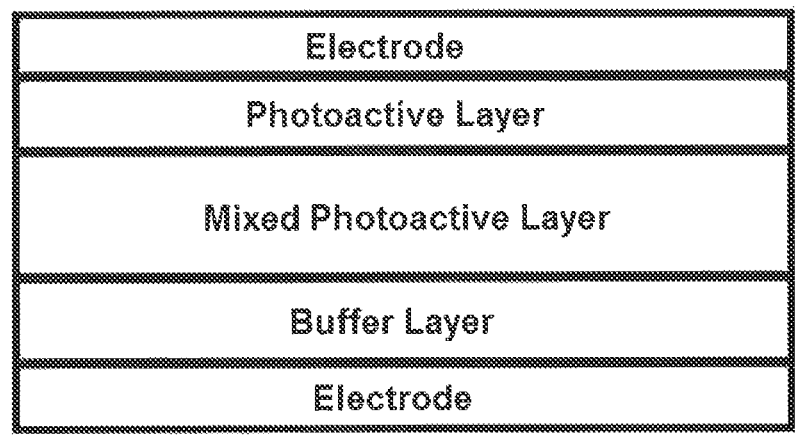
FIG. 1 shows a schematic of an exemplary device according to the present disclosure.

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less that 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

In the context of the organic materials of the present disclosure, the terms "donor" and "acceptor" refer to the relative positions of the HOMO and LUMO energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

Certain embodiments of the present disclosure are directed to organic photosensitive optoelectronic devices comprising: two electrodes in superposed relation; a mixed photoactive layer located between the two electrodes, wherein the mixed photoactive layer comprises at least one donor material having a HOMO energy and at least one acceptor material having a LUMO energy, wherein the at least one donor material and the at least one acceptor material form a mixed donor-acceptor heterojunction; a photoactive layer adjacent to and interfacing with the mixed photoactive layer, wherein the photoactive layer comprises a material having a LUMO energy within 0.3 eV of the LUMO energy of the at least one acceptor material or a HOMO energy within 0.3 eV of the HOMO energy of the at least one donor material; and a buffer layer adjacent to and interfacing with the mixed photoactive layer.

A non-limiting device schematic in accordance with the present disclosure is shown in FIG. 1. In some embodiments, the device does not comprise the buffer layer. In such embodiments, the mixed photoactive layer may be adjacent to and may interface with an electrode.

One of the electrodes of the present disclosure may be an anode, and the other electrode a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner.

The mixed photoactive layer of the present disclosure comprises at least one donor material and at least one acceptor material. Examples of suitable donor materials include but are not limited to phthalocyanines, such as copper phthalocyanine(CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, thiophenes, such as poly(3-hexylthiophene) (P3HT), low band-gap polymers, polyacenes, such as pentacene and tetracene, diindenoperylene (DIP), squaraine (SQ) dyes, and tetraphenyldibenzoperiflanthene (DBP). Other organic donor materials are contemplated by the present disclosure.

Examples of squaraine donor materials include but are not limited to 2,4-bis[4-(N,N-dipropylamino)-2,6-dihydroxyphenyl]squaraine, 2,4-bis[4-(N,Ndiisobutylamino)-2,6-dihydroxyphenyl]squaraine, 2,4-bis[4-(N,N-diphenylamino)-2,6-dihydroxyphenyl]squaraine (DPSQ) and salts thereof. Additional examples of suitable squaraine materials are disclosed in U.S. Patent Publication No. 2012/0248419, which is incorporated herein by reference for its disclosure of squaraine materials.

Examples of suitable acceptor materials for the present disclosure include but are not limited to polymeric or non-polymeric perylenes, polymeric or non-polymeric naphthalenes, and polymeric or non-polymeric fullerenes and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60]PCBM), Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}$CuPc), and derivatives thereof. Other organic acceptor materials are contemplated by the present disclosure.

In some embodiments, the at least one donor material is present in the mixed photoactive layer in an amount less than the at least one acceptor material. In certain embodiments, the mixed photoactive layer comprises the at least one donor material and the at least one acceptor material at a donor: acceptor ratio ranging from 1:1 to 1:50, such as, for example, from 1:2 to 1:50, from 1:3 to 1:35, from 1:4 to 1:25, from 1:4 to 1:20, from 1:4 to 1:16, from 1:5 to 1:15, or from 1:6 to 1:10. In certain embodiments, the mixed photoactive layer comprises the at least one donor material and the at least one acceptor material at a donor:acceptor ratio of 1:8.

In some embodiments, the at least one acceptor material is present in the mixed photoactive layer in an amount less than the at least one donor material. In certain embodiments, the mixed photoactive layer comprises the at least one acceptor material and the at least one donor material at an acceptor:donor ratio ranging from 1:1 to 1:50, such as, for example, from 1:2 to 1:50, from 1:3 to 1:35, from 1:4 to 1:25, from 1:4 to 1:20, from 1:4 to 1:16, from 1:5 to 1:15, or from 1:6 to 1:10.

As shown in FIG. 1, a photoactive layer is adjacent to and interfaces with the mixed photoactive layer. The photoactive layer may comprise a material having a LUMO energy within 0.3 eV, within 0.2 eV, within 0.1 eV, or within 0.05 eV of the LUMO energy of the at least one acceptor material, or the photoactive layer may comprise a material having a HOMO energy within 0.3 eV, within 0.2 eV, within 0.1 eV, or within 0.05 eV of the HOMO energy of the at least one donor material. In some embodiments, at least 50%, at least 60%, at least 70%, at least 80%, at least 90%, at least 95%, at least 96%, at least 97%, at least 98%, at least 99%, or at least 99.9% of material comprising the photoactive layer is the material having a LUMO energy within 0.3 eV, within 0.2 eV, within 0.1 eV, or within 0.05 eV of the LUMO energy of the at least one acceptor material, or a HOMO energy within 0.3 eV, within 0.2 eV, within 0.1 eV, or within 0.05 eV of the HOMO energy of the at least one donor material. In certain embodiments, the material having a LUMO energy within 0.3 eV, within 0.2 eV, within 0.1 eV, or within 0.05 eV of the LUMO energy of the at least one acceptor material is the same material as the at least one acceptor material. In certain embodiments, the material having a HOMO energy within 0.3 eV, within 0.2 eV, within 0.1 eV, or within 0.05 eV of the HOMO energy of the at least one donor material photoactive layer is the same material as the at least one donor material. In some embodiments, the photoactive layer has a thickness less than 50 nm, less than 40 nm, less than 30 nm, less than 25 nm, less than 20 nm, less than 15 nm, less than 10 nm, less than 8 nm, less than 5 nm, less than 3 nm, or less than 1 nm.

The photoactive layer of the present disclosure may generate excitons while placing the mixed photoactive layer in an improved optical position in the layer stack, i.e., it may act as an optical spacer. Such an optical spacer can redistribute the optical power inside the device, which in some embodiments can significantly improve the performance of the device. For example, in embodiments where excitons can be quenched without dissociation at an interface between the mixed photoactive layer and the buffer layer, the photoactive layer can redistribute the optical power away from such quenching interface, allowing a greater percentage of excitons to dissociate in the mixed photoactive layer.

The buffer layer may comprise materials known in the art. The buffer layer may be selected so as not to inhibit the transport of a desired carrier to an electrode. In some embodiments, the buffer layer is an electron or hole transport material. In some embodiments, the buffer layer is an exciton-blocking electron or exciton-blocking hole transport material. In some embodiments, the buffer layer is an organic material. In some embodiments, the buffer layer is a metal oxide. In some embodiments, the buffer layer is a conductive polymer. Examples of buffer materials include but are not limited to $MoO_3$, $V_2O_5$, $WO_3$, $CrO_3$, $Co_3O_4$, NiO, ZnO, $TiO_2$, polyanaline (PANI), poly(3,4-ethylenedioxythiophene), and poly(styrenesulfonate) (PEDOT-PSS). In some embodiments, the buffer layer is a self-assembled monolayer.

In some embodiments, the buffer layer quenches excitons at its interface with the mixed photoactive layer.

Also disclosed herein are organic photosensitive optoelectronic devices comprising: two electrodes in superposed relation; a mixed photoactive layer located between the two electrodes, wherein the mixed photoactive layer comprises at least one donor material having a HOMO energy and at least one acceptor material having a LUMO energy, wherein the at least one donor material and the at least one acceptor material form a mixed donor-acceptor heterojunction; a photoactive layer adjacent to and interfacing with the mixed photoactive layer, wherein the photoactive layer comprises a material having a LUMO energy within 0.3 eV of the LUMO energy of the at least one acceptor material or a HOMO energy within 0.3 eV of the HOMO energy of the at least one donor material, and wherein the mixed photoactive layer comprises the at least one donor material and the at least one acceptor material at a donor:acceptor ratio ranging from 1:1 to 1:50, such as, for example, from 1:2 to 1:50, from 1:3 to 1:35, from 1:4 to 1:25, from 1:4 to 1:20, from 1:4 to 1:16, from 1:5 to 1:15, or from 1:6 to 1:10. In some embodiments, the device optionally includes the buffer layer adjacent to and interfacing with the mixed photoactive layer.

Also disclosed herein are organic photosensitive optoelectronic devices comprising: two electrodes in superposed relation; a mixed photoactive layer located between the two electrodes, wherein the mixed photoactive layer comprises at least one donor material having a HOMO energy and at least one acceptor material having a LUMO energy, wherein the at least one donor material and the at least one acceptor material form a mixed donor-acceptor heterojunction; a photoactive layer adjacent to and interfacing with the mixed photoactive layer, wherein the photoactive layer comprises a material having a LUMO energy within 0.3 eV of the LUMO energy of the at least one acceptor material or a HOMO energy within 0.3 eV of the HOMO energy of the at least one donor material, and wherein the photoactive layer has a thickness less than 50 nm, less than 40 nm, less than 30 nm, less than 25 nm, less than 20 nm, less than 15 nm, less than 10 nm, less than 8 nm, less than 5 nm, less than 3 nm, or less than 1 nm. In some embodiments, the device optionally includes the buffer layer adjacent to and interfacing with the mixed photoactive layer.

As shown in FIG. 1, in some embodiments of the present disclosure, the photoactive layer is adjacent to and interfaces with a horizontal plane of the mixed photoactive layer. In some embodiments, the buffer layer is adjacent to and interfaces with an opposing horizontal plane of the mixed photoactive layer.

Organic photosensitive optoelectronic devices of the present disclosure may further comprise additional layers as known in the art for such devices. For example, devices may further comprise charge carrier transport layers and/or buffers layers such as one or more blocking layers, such as an exciton blocking layer (EBL). In some embodiments, one or more blocking layers are located between an electrode and the photoactive layer. In some embodiments, one or more blocking layers are located between an electrode and the mixed layer, or in certain embodiments, between the an electrode and the buffer layer. With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris(acetylacetonato)ruthenium(III) (Ru(acac)3), and aluminum(III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

In addition, the devices may further comprise at least one smoothing layer. A smoothing layer may be located, for example, between a photoactive region and either or both of the electrodes. A film comprising 3,4 polyethylenedioxythiophene:polystyrenesulfonate (PEDOT:PSS) is an example of a smoothing layer.

The organic photosensitive optoelectronic devices of the present disclosure may exist as a tandem device comprising two or more subcells. A subcell, as used herein, means a component of the device which comprises at least one donor-acceptor heterojunction. When a subcell is used individually as a photosensitive optoelectronic device, it typically includes a complete set of electrodes. A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, $MoO_3$, Li, LiF, Sn, Ti, WO3, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

The devices of the present disclosure may be, for example, photodetectors, photoconductors, or photovoltaic devices, such as solar cells.

Layers and materials may be deposited using techniques known in the art. For example, the layers and materials described herein can be deposited or co-deposited from a solution, vapor, or a combination of both. In some embodiments, organic materials or organic layers can be deposited or co-deposited via solution processing, such as by one or more techniques chosen from spin-coating, spin-casting, spray coating, dip coating, doctor-blading, inkjet printing, or transfer printing.

In other embodiments, organic materials may be deposited or co-deposited using vacuum evaporation, such as vacuum thermal evaporation, organic vapor phase deposition, or organic vapor-jet printing.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

Example 1

Photoluminescence Measurements of DBP and $C_{70}$ Films

To investigate the influence of $MoO_3$ on exciton dissociation, and therefore OPV efficiency, the photolumines-cence (PL) excitation spectra of 60 nm-thick DBP and $C_{70}$ films in contact with an 8 nm-thick $MoO_3$ layer on quartz were measured. For comparison, 8 nm-thick bathophenanthorline (BPhen) layers were used as exciton blocking layers for both DBP and $C_{70}$, while $C_{60}$ and N,N'-diphenyl-N,N'-bis(I-naphthyl)-1-1'biphenvl-4,4'diamine (NPD) were employed as exciton quenching layers for DBP and $C_{70}$, respectively. All of these films were capped with a 10 nm-thick BPhen exciton blocking layer. The photoluminescence spectra of DBP and $C_{70}$ films photoluminescence were measured with illumination through the glass substrate and excited at wavelengths of $\lambda$=530 nm and 460 nm, respectively.

Figure 3:
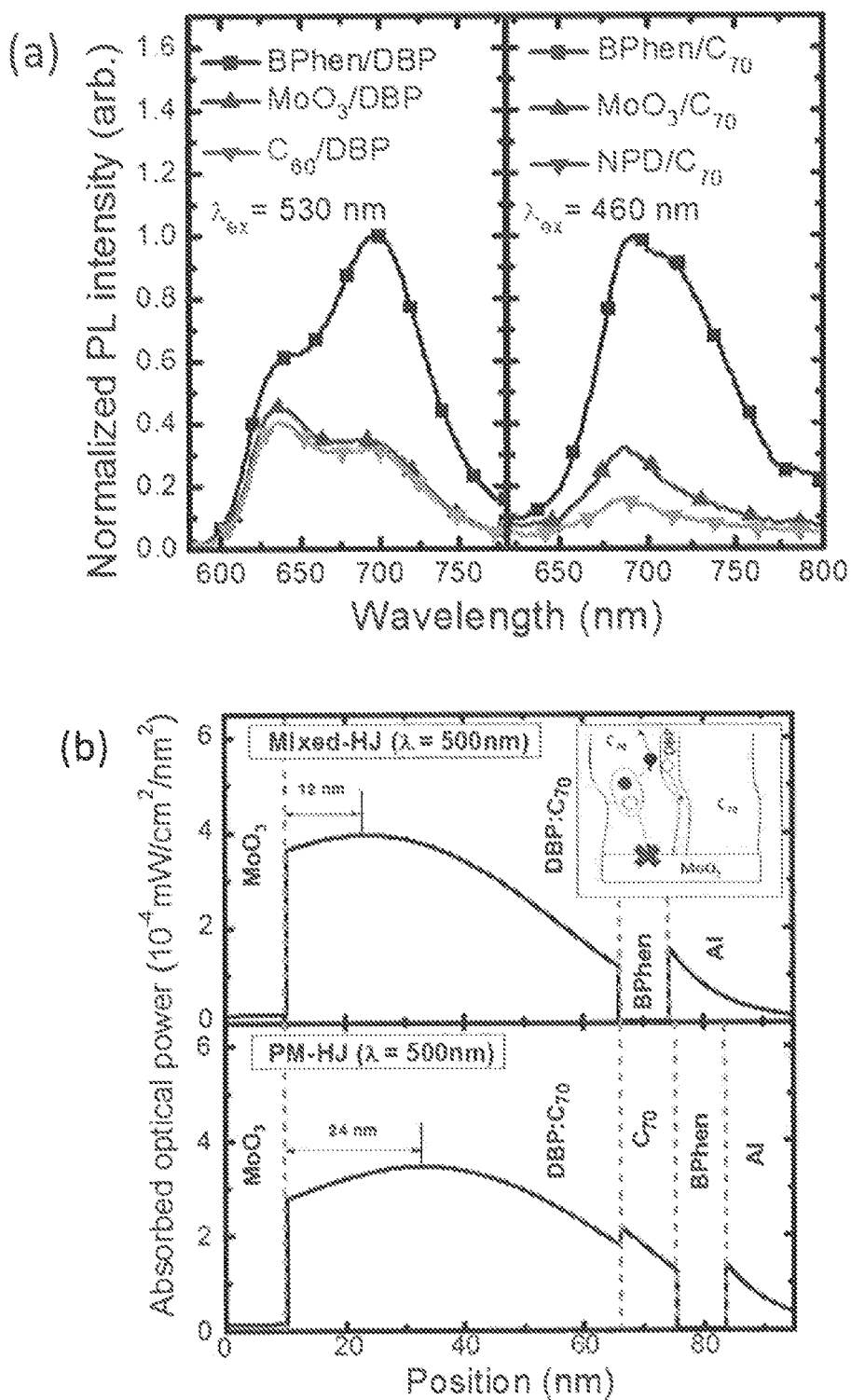
FIG. 3(a) shows the photoluminescence (PL) excitation spectra of DBP and $C_{70}$ films with $MoO_3$, exciton blocking (BPhen) and quenching ($C_{60}$, NPD) layers.
FIG. 3(b) shows the spatial distribution of absorbed optical power in the mixed-HJ and PM-HJ cells at a wavelength of $\lambda=500$ nm.

The results of these measurements are depicted in FIG. 3(a). The $MoO_3$/DBP sample had a PL intensity comparable to that of a film employing a quenching $C_{60}$/DBP interface. Similarly, the $MoO_3$/$C_{70}$ interface had slightly higher PL intensity than that of the quenching NPD/$C_{70}$ sample. In both cases, their PL intensities were significantly reduced compared to those employing the blocking BPhen/$C_{70}$ and BPhen/DBP interfaces. These results indicate that $MoO_3$ quenches rather than blocks excitons, as previously expected.

Example 2

Production of OPV Cells

OPV cells were grown on glass substrates coated with 100 nm-thick ITO with a sheet resistance of 15Ω/□. Prior to thin film deposition, substrates were cleaned in detergent, deionized water and a sequence of organic solvents, followed by exposure to ultraviolet (UV)-ozone for 10 min. The substrates were then transferred into a high vacuum chamber with a base pressure of $10^{-7}$ torr.

$MoO_3$, $C_{70}$ and BPhen layers were deposited at a rate of 0.5 Å/sec, DBP and $C_{70}$ were co-deposited using a DBP deposition rate of 0.2 Å/sec, while the deposition rate of $C_{70}$ was adjusted to achieve the desired volume ratio. A shadow mask with an array of 1 mm-diameter circular openings was used to pattern the 1000 Å-thick Al cathode, thereby defining the cell area.

The substrates were directly transferred into a glove box filled with ultrahigh purity $N_2$ where current density-voltage (J-V) in the dark and under simulated AM 1.5 G solar irradiation, and the EQE were measured. A National Renewable Energy Laboratory traceable Si reference cell was used to determine optical power. The EQE was measured using monochromated light from a Xe-lamp and chopped at 200 Hz, referenced to a NREL-traceable Si detector. The short circuit current, $J_{sc1}$, was corrected for spectral mismatch.

Figure 2:
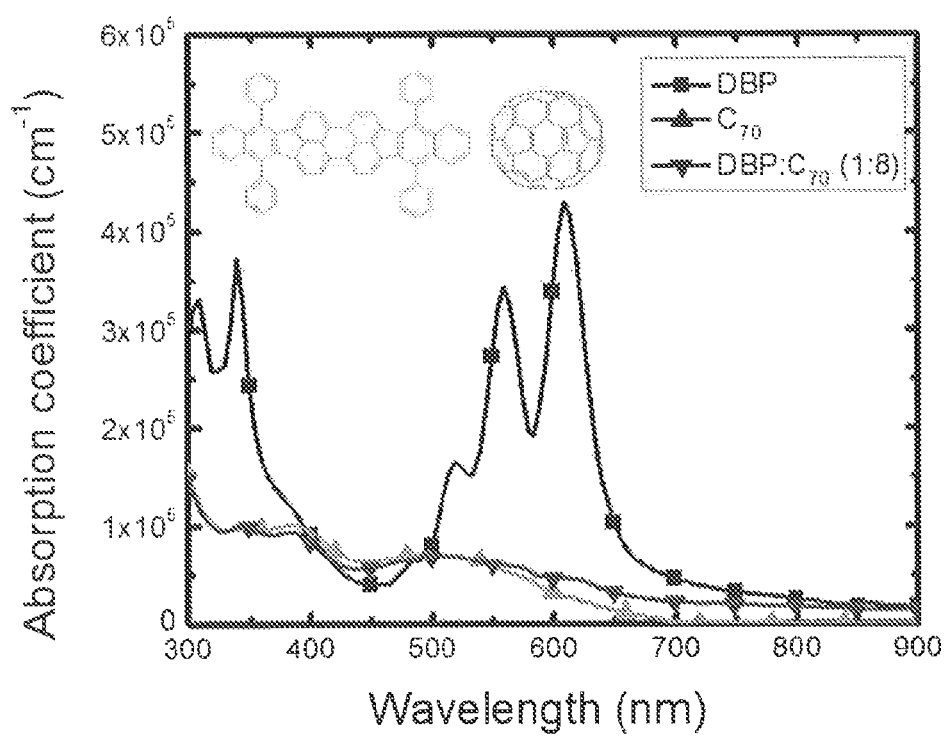
FIG. 2 shows the absorption spectra of DBP, $C_{70}$ and a 1:8 DBP:$C_{70}$ mixture. Inset: Molecular structural formulae of DBP (left), $C_{70}$ (right)

Tetraphenyldibenzoperiflanthene (DBP) was used as the donor material, and $C_{70}$ was used as the acceptor material. DBP has a high absorption coefficient (see FIG. 2), a high hole mobility, $_-10^{-4}$ cm$^2$/(V·s), a highest occupied molecular orbital (HOMO) energy of −5.5 eV, and an exciton diffusion length of 16±1 nm measured by spectrally resolved luminescence quenching. $C_{70}$ has a broad absorption spectrum between $\lambda$=350 nm to 700 nm. The resulting blend of DBP and $C_{70}$ can strongly absorbed between $\lambda$=350 nm to 700 nm.

Vacuum thermally evaporated $MoO_3$ was used as an anode buffer layer due to its large work function (which improves the hole collection efficiency at the anode), high transmittance and low series resistance.

Figure 4:
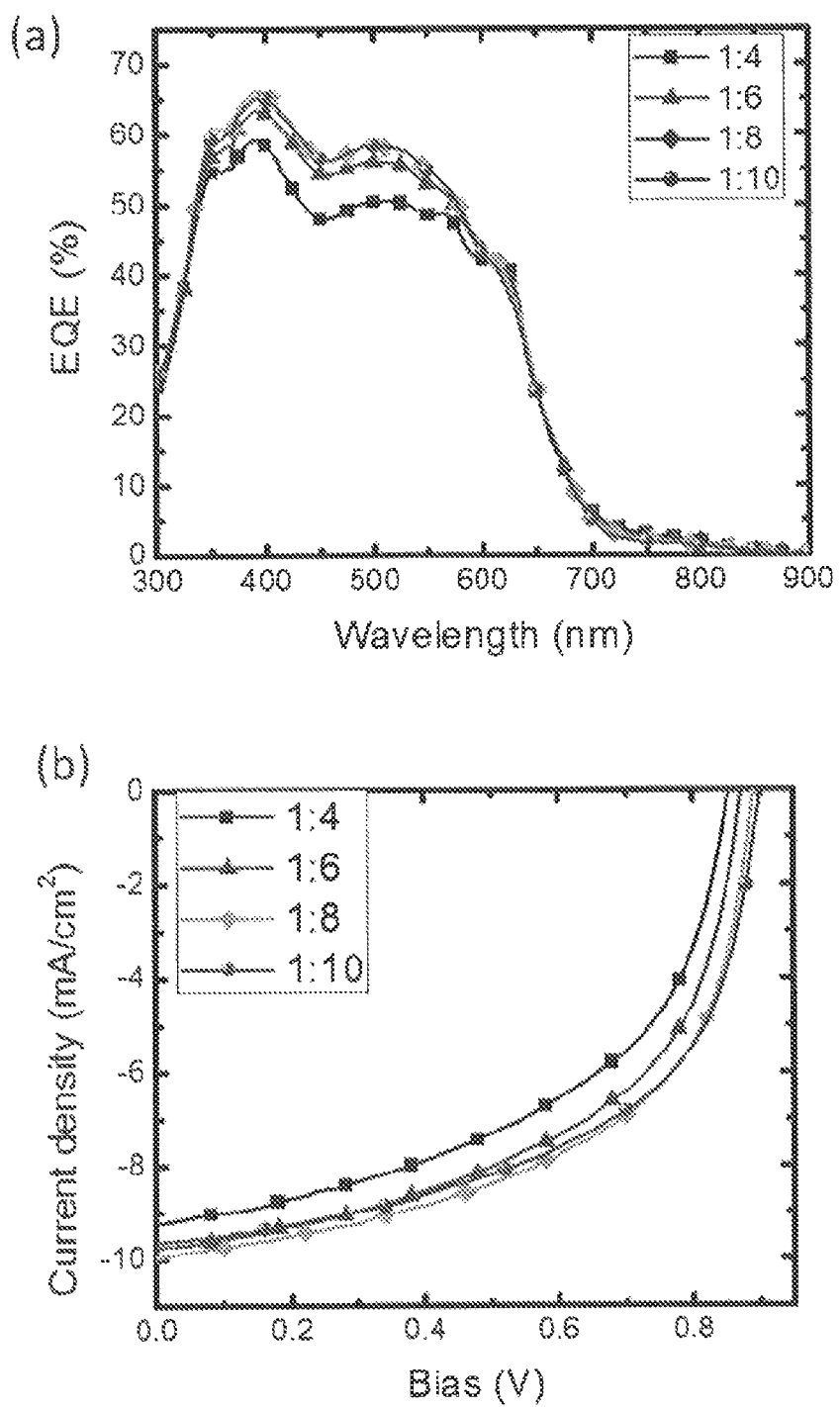
FIG. 4(a) shows the external quantum efficiency (EQE)
FIG. 4(b) shows the current density vs. voltage (J-V) characteristics under simulated AM1.5 G, one sun illumination as a function of ratio between DBP:$C_{70}$ (I:x).

DBP to $C_{70}$ in the PM-HJ structure was optimized, such that the EQE integrated over the solar spectrum was maximized for a 1:8 DBP:$C_{70}$ mixture (see FIG. 4(a)). The open circuit voltage ($V_{OC}$) increased monotonically with decreasing DBP concentration as shown in FIG. 4(b), which was likely due to a reduced polaron-pair recombination rate. The fill factor increased with decreasing DBP concentration, reaching a maximum of FF=56±0.01 at a 1:8 ratio, and remained almost unchanged as the DBP concentration was further reduced in this partially mixed, heterogenous region. This was likely due to balanced electron and hole mobilities in the mixed photoactive layer domains, which can reduce bimolecular recombination.

Figure 5:
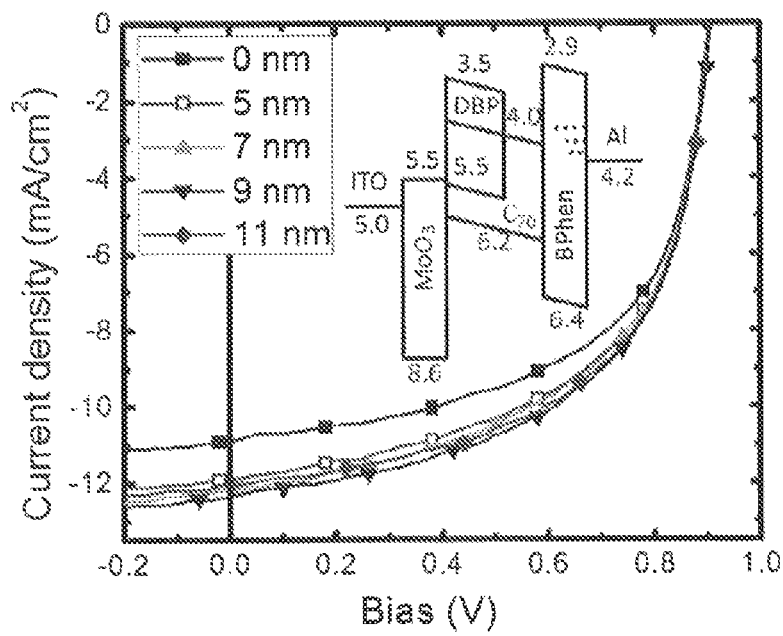
FIG. 5 shows the spectrally-corrected current density vs. voltage (J-V) characteristics under simulated AM1.5 G, one sun illumination as a function of the thickness (x) of the neat $C_{70}$ cap layer.

The J-V characteristics of the cells with different $C_{70}$ cap thicknesses under AM1.5 G, 1 sun intensity simulated solar illumination are shown in FIG. 5, with device performance characteristics summarized in Table I. All cells had $V_{OC}$=0.91±0.01 V, and a fill factor of FF=0.56±0.01. The mixed-HJ cell had $J_{SC}$=10.7±0.2 mA/cm², resulting in a power conversion efficiency of PCE=5.7±0.1%. The addition of a $C_{70}$ layer (x=9 nm) led to an increase in $J_{SC}$ to 12.3±0.3 mA/cm², resulting in PCE=6.4±0.3%.

Figure 6:
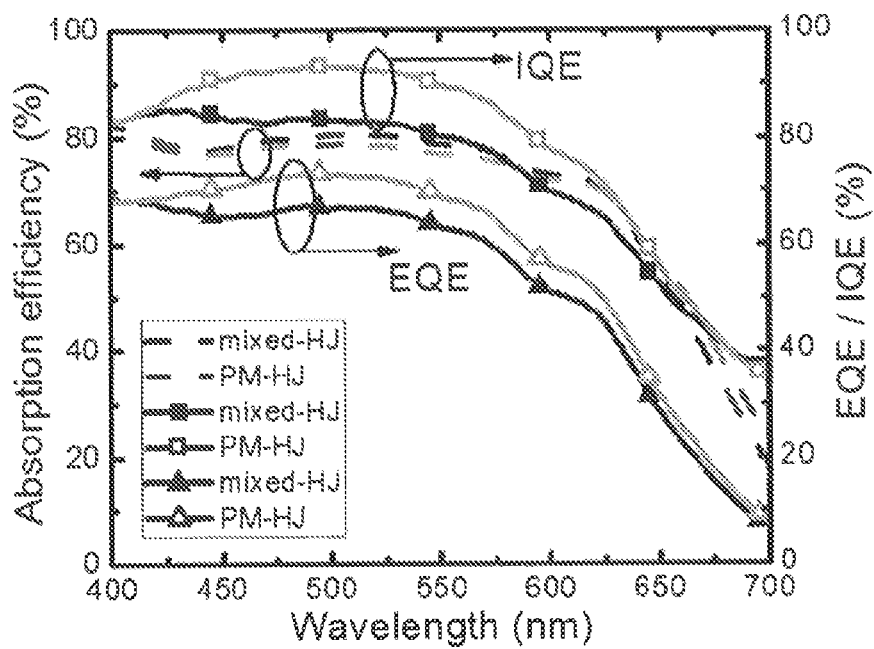
FIG. 6 shows the absorption efficiency (dashed lines), external quantum efficiency (triangles), and internal quantum efficiency ((IQE), squares) spectra for the mixed-HJ and PM-HJ OPV cells.

As the $C_{70}$ thickness increased to x=9 nm, the EQE of the PM-HJ cell increased by up to 10% between λ=400 nm and 700 nm compared to the mixed-HJ cell (see FIG. 6). This, in turn, led to a 15% increase in $J_{SC}$. As x was increased further to 11 nm, $J_{SC}$ decreased to 12.0±0.2 mA/cm². The EQE of the PM-HJ cell with a 9 nm-thick $C_{70}$ layer was >70% between λ=450 nm and 550 nm, and averaged >65% within the spectral range from λ=350 nm to 650 nm, leading to $J_{SC}$=12.3±0.3 mA/cm².

The internal quantum efficiency, IQE, is defined as the ratio of free carriers collected at the electrodes to photons absorbed in the photoactive layers. The transfer matrix method was used to calculate the absorption efficiency, $\eta_A$, to further understand the origin of improvement in EQE in the PM-HJ cell. Based on the optical simulation, the mixed-HJ and PM-HJ cells showed similar absorption spectra with $\eta_A$>75% between λ=400 nm and 650 nm, as shown in FIG. 6. The PM-HJ cell had IQE>90% within the spectral range of λ=450 nm and 550 nm, while the IQE of the mixed-HJ cell was only ~80% in the same spectral region (FIG. 6). The addition of the $C_{70}$ layer in the PM-HJ cell redistributed the optical field inside the photoactive layer, as shown in FIG. 3(b), leading to increased exciton generation and dissociation in the cell photoactive region and reduced exciton quenching at the $MoO_3$/organic interface.

TABLE 1

| Cell Structure (x nm) | $V_{OC}$ (V) | $I_{SC}$ (mA/cm³) | FF | PCE (%) 1 sun, AM1.5G | Spectral mismatch factor |
|---|---|---|---|---|---|
| mixed-HJ (0) | 0.90 (±0.01) | 10.7 (±0.2) | 0.57 (±0.02) | 5.2 (±0.2) | 1.03 |
| PM-HJ (5) | 0.91 (±0.01) | 11.9 (±0.2) | 0.56 (±0.01) | 6.1 (±0.2) | 1.04 |
| PM-HJ (7) | 0.91 (±0.01) | 12.1 (±0.2) | 0.56 (±0.01) | 6.2 (±0.2) | 1.03 |

TABLE 1-continued

| Cell Structure (x nm) | $V_{OC}$ (V) | $I_{SC}$ (mA/cm³) | FF | PCE (%) 1 sun, AM1.5G | Spectral mismatch factor |
|---|---|---|---|---|---|
| PM-HJ (9) | 0.91 (±0.01) | 12.3 (±0.3) | 0.56 (±0.01) | 6.4 (±0.3) | 1.03 |
| PM-HJ (11) | 0.91 (±0.01) | 12.0 (±0.2) | 0.56 (±0.01) | 6.2 (±0.2) | 1.04 |

What is claimed is:

1. An organic photosensitive optoelectronic device comprising:
   two electrodes in superposed relation;
   a mixed photoactive layer located between the two electrodes, wherein the mixed photoactive layer is a single layer comprising a mixture of at least one donor material having a highest occupied molecular orbital (HOMO) energy and at least one acceptor material having a lowest unoccupied molecular orbital (LUMO) energy, wherein the at least one donor material and the at least one acceptor material form a mixed donor-acceptor heterojunction;
   a photoactive layer adjacent to and interfacing with the mixed photoactive layer, wherein the photoactive layer is a single layer comprising a material having a LUMO energy within 0.3 eV of the LUMO energy of the at least one acceptor material; and
   a buffer layer adjacent to and interfacing with the mixed photoactive layer, wherein the buffer layer comprises a metal oxide;
   wherein the mixed photoactive layer comprises the at least one donor material and the at least one acceptor material at a donor:acceptor ratio ranging from 1:4 to 1:25; and
   wherein the photoactive layer has a total thickness less than 10 nm.

2. The device of claim 1, wherein the photoactive layer comprises a material having a LUMO energy within 0.1 eV of the LUMO energy of the at least one acceptor material.

3. The device of claim 1, wherein the material having a LUMO energy within 0.3 eV of the LUMO energy of the at least one acceptor material is the same material as the at least one acceptor material.

4. The device of claim 1, wherein the at least one acceptor material comprises a fullerene or derivative thereof.

5. The device of claim 4, wherein the at least one donor material comprises tetraphenyldibenzoperiflanthene (DBP).

6. The device of claim 5, wherein the donor:acceptor ratio is about 1:8.

7. The device of claim 4, wherein the photoactive layer has a total thickness of about 9 nm.

8. The device of claim 1, wherein the donor:acceptor ratio ranges from 1:6 to 1:10.

9. The device of claim 1, wherein the buffer layer quenches excitons at the interface between the buffer layer and the mixed photoactive layer.

* * * * *